(12) United States Patent
Matsushita

(10) Patent No.: US 11,426,773 B2
(45) Date of Patent: Aug. 30, 2022

(54) LOAD PORT AND CONTROL METHOD

(71) Applicant: HIRATA CORPORATION, Kumamoto (JP)

(72) Inventor: Yoichi Matsushita, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 0 days.

(21) Appl. No.: 17/203,808

(22) Filed: Mar. 17, 2021

(65) Prior Publication Data

US 2021/0291236 A1 Sep. 23, 2021

(30) Foreign Application Priority Data

Mar. 23, 2020 (JP) .............................. JP2020-051712

(51) Int. Cl.
*B08B 5/02* (2006.01)
*H01L 21/673* (2006.01)
*H01L 21/677* (2006.01)

(52) U.S. Cl.
CPC .......... *B08B 5/02* (2013.01); *H01L 21/67379* (2013.01); *H01L 21/67393* (2013.01); *H01L 21/67775* (2013.01)

(58) Field of Classification Search
CPC ......... H01L 21/67775; H01L 21/67772; H01L 21/67393; H01L 21/67379
See application file for complete search history.

(56) References Cited

U.S. PATENT DOCUMENTS

| | | | | |
|---|---|---|---|---|
| 2006/0213842 A1* | 9/2006 | Shani | ............... | H01L 21/67393 211/1 |
| 2006/0288664 A1* | 12/2006 | Okabe | ............... | H01L 21/67393 53/510 |
| 2020/0051844 A1* | 2/2020 | Bellet | ................... | B65G 47/91 |
| 2021/0035830 A1* | 2/2021 | Kim | ................. | H01L 21/67017 |

FOREIGN PATENT DOCUMENTS

| | | | | |
|---|---|---|---|---|
| JP | 4328123 | B2 | 9/2009 | |
| JP | 2016178239 | A * | 10/2016 | ....... H01L 21/67775 |
| JP | 6038476 | B2 | 12/2016 | |
| JP | 2018006705 | A | 1/2018 | |
| JP | 2019-186293 | A | 10/2019 | |
| TW | 201943007 | A | 11/2019 | |

OTHER PUBLICATIONS

Office Action dated Oct. 12, 2021, in corresponding Taiwanese Patent Application No. 110109755. (3 pages).

* cited by examiner

*Primary Examiner* — Glenn F Myers
(74) *Attorney, Agent, or Firm* — Buchanan Ingersoll & Rooney PC

(57) ABSTRACT

A load port includes a dock plate on which a container storing a substrate is placed, a port plate, a moving mechanism configured to move the dock plate between a dock position and an undock position, a gas supply nozzle unit provided in the dock plate and configured to contact a bottom surface of the container placed on the dock plate and supply a gas into the container, and a pressing unit provided above the dock plate and configured to press the container placed on the dock plate downward. The pressing unit includes a contact member brought into contact with the container placed on the dock plate, and a driving mechanism configured to move the contact member between a first position apart from the container and a second position in contact with the container.

5 Claims, 14 Drawing Sheets

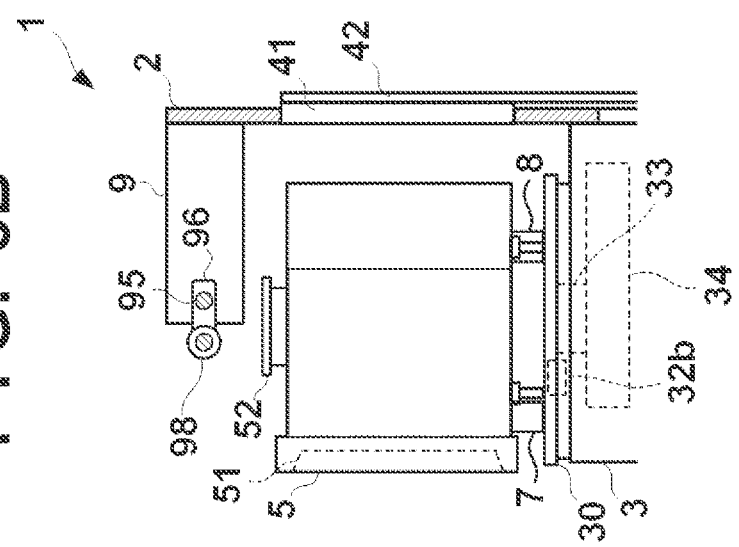
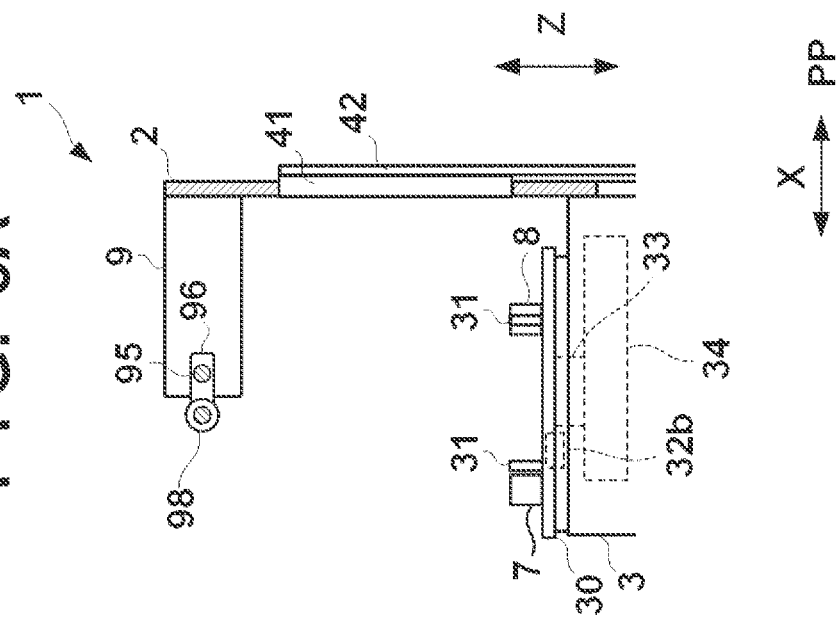

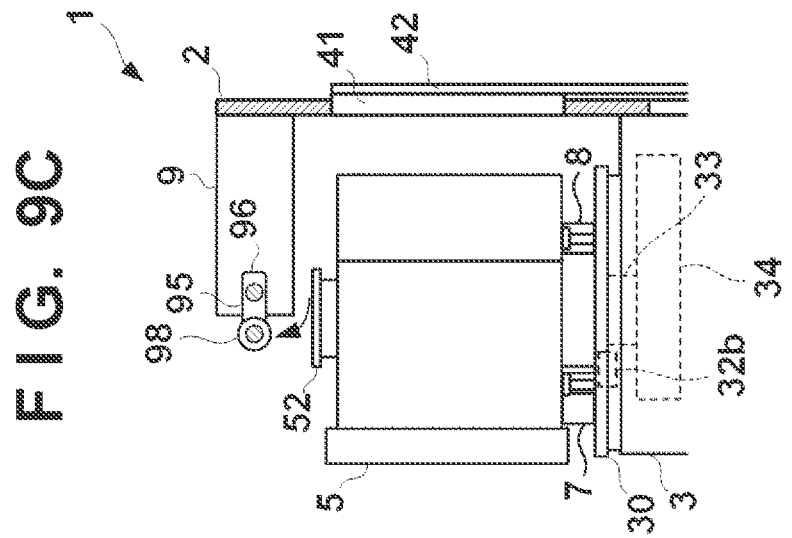
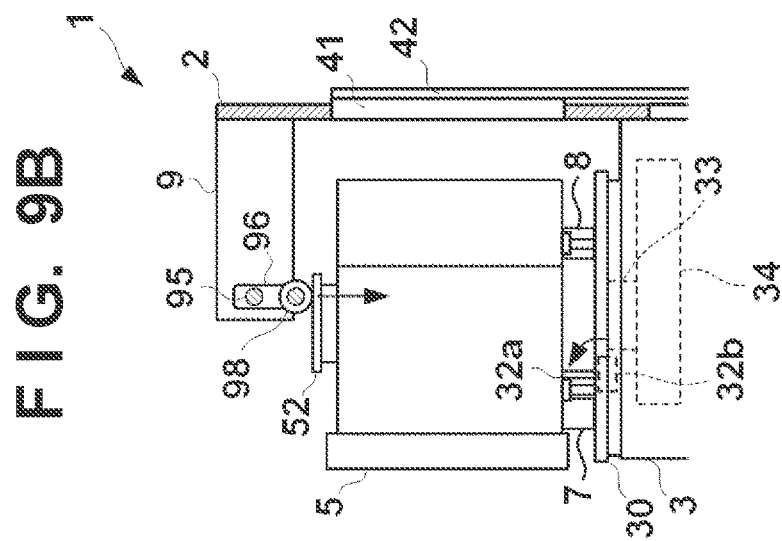
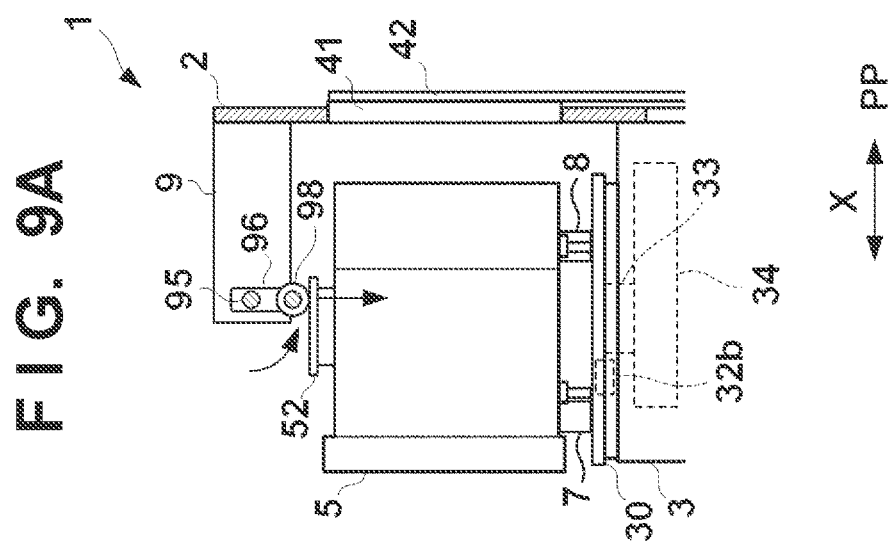

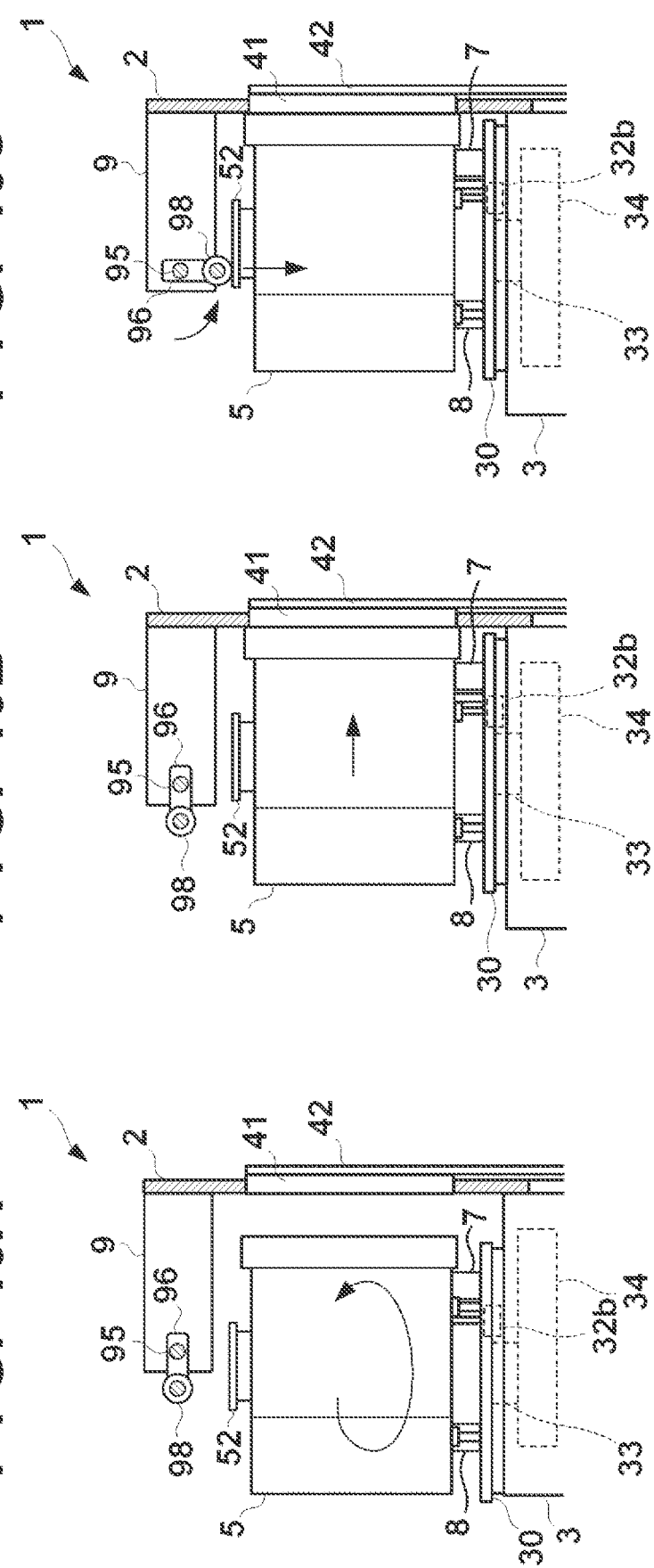

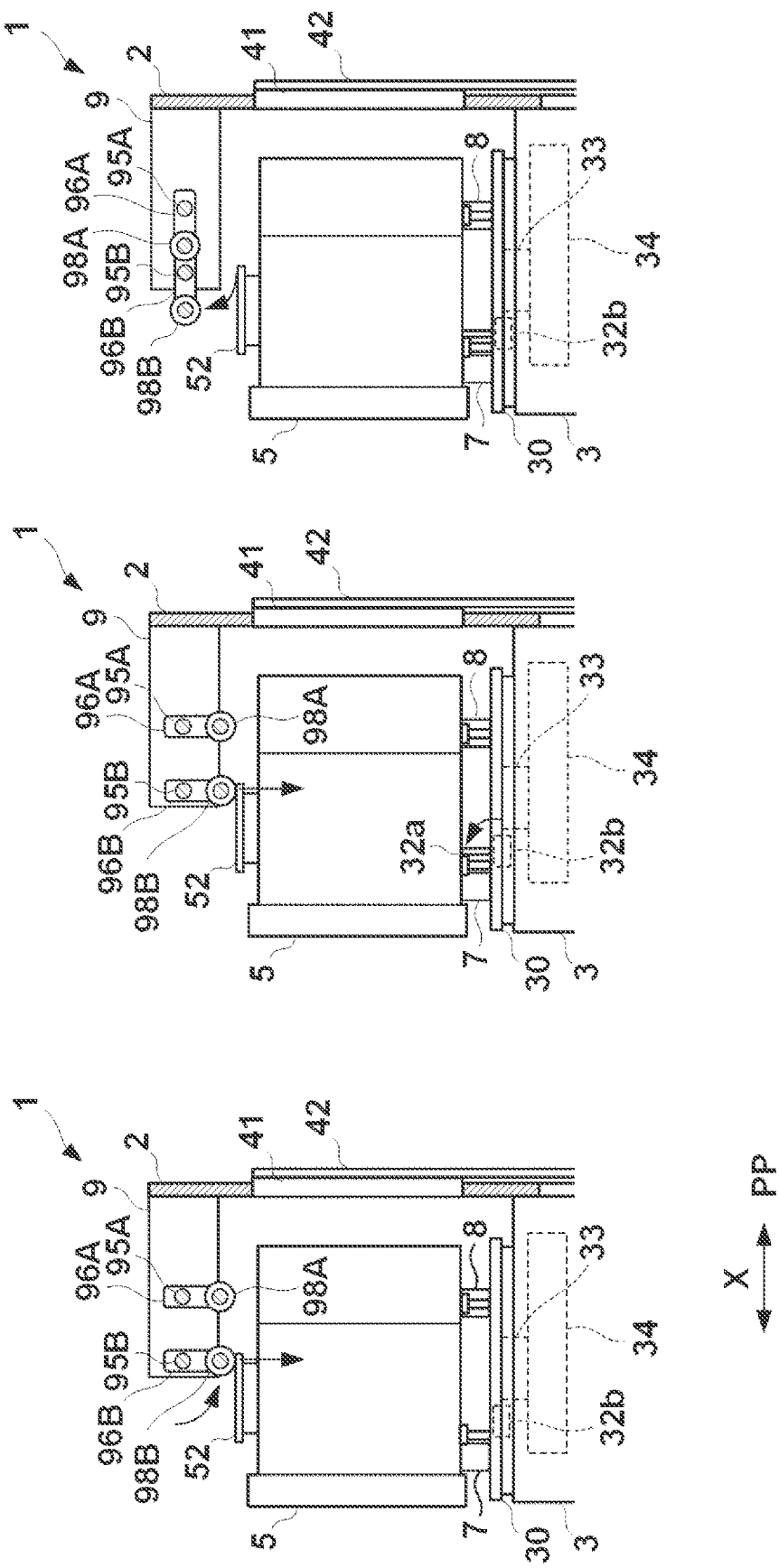

LOAD PORT AND CONTROL METHOD

CROSS-REFERENCE TO RELATED APPLICATION(S)

This application claims priority to and the benefit of Japanese Patent Application No. 2020-051712 filed on Mar. 23, 2020, the entire disclosure of which is incorporated herein by reference.

BACKGROUND OF THE INVENTION

Field of the Invention

The present invention relates to a load port.

Description of the Related Art

A container such as a FOUP, which stores a substrate such as a semiconductor wafer, is known. Such a container is opened/closed in a load port provided in a substrate conveying apparatus to take in or out the substrate in the container (Japanese Patent Laid-Open No. 2018-6705 and Japanese Patent Nos. 6038476 and 4328123). There has been proposed a technique of purging the inside of a container by supplying a gas such as nitrogen gas into the container when taking in or out a substrate (patent literature 3). When a gas with a pressure higher than the atmospheric pressure is supplied into the container to make the pressure in the container positive, for example, oxidation of the substrate or entry of particles into the container can be suppressed.

As a method of purging the inside of a container in a shorter time, a method of increasing the gas supply amount per unit time when supplying a gas into the container, that is, increasing the supply flow velocity or making the supply pressure high can be considered. When the supply flow velocity of the gas is increased, or the supply pressure is made high, the purge port of the container may float up from a gas supply nozzle, resulting in a decrease in adhesion. Hence, the gas may leak from the container without entering the purge port. It is therefore effective to increase the elastic force of an elastic member provided in the gas supply nozzle unit to increase the adhesion between the gas supply nozzle and the purge port and prevent the leakage of the gas. However, if the elastic force of the elastic member is strong, when the container is placed on a dock plate, the container may float from the dock plate somewhat. The dock plate is provided with a lock mechanism that locks the placed container to the dock plate. If the lock mechanism is operated in a state in which the container floats, the engaging claw of the lock mechanism may be unable to engage with (reach) the engaging claw of the container, and the lock mechanism may idle (cannot lock).

SUMMARY OF THE INVENTION

It is an object of the present invention to provide a load port capable of, when supplying a gas into a container to perform purge, preventing leakage of the gas from the container and performing purge in a short time.

According to an aspect of the present invention, there is provided a load port comprising: a dock plate on which a container storing a substrate is placed; a port plate including an opening portion capable of taking in and out the substrate; a moving mechanism configured to move the dock plate between a dock position close to the port plate and an undock position apart from the port plate; a gas supply nozzle unit provided in the dock plate and configured to contact a bottom surface of the container placed on the dock plate and supply a gas into the container; and a pressing unit provided above the dock plate and configured to press the container placed on the dock plate downward, wherein the pressing unit includes: a contact member brought into contact with the container placed on the dock plate; and a driving mechanism configured to move the contact member between a first position apart from the container and a second position in contact with the container.

Further features of the present invention will become apparent from the following description of exemplary embodiments (with reference to the attached drawings).

BRIEF DESCRIPTION OF THE DRAWINGS

FIGS. 8A and 8B are explanatory views of the operation of the load port shown in FIG. 1;

FIGS. 9A to 9C are explanatory views of the operation of the load port shown in FIG. 1;

FIGS. 10A to 10C are explanatory views of the operation of the load port shown in FIG. 1;

FIGS. 13A to 13C are explanatory views of the operation of the load port using the pressing unit shown in FIG. 11A.

DESCRIPTION OF THE EMBODIMENTS

Figure 1:
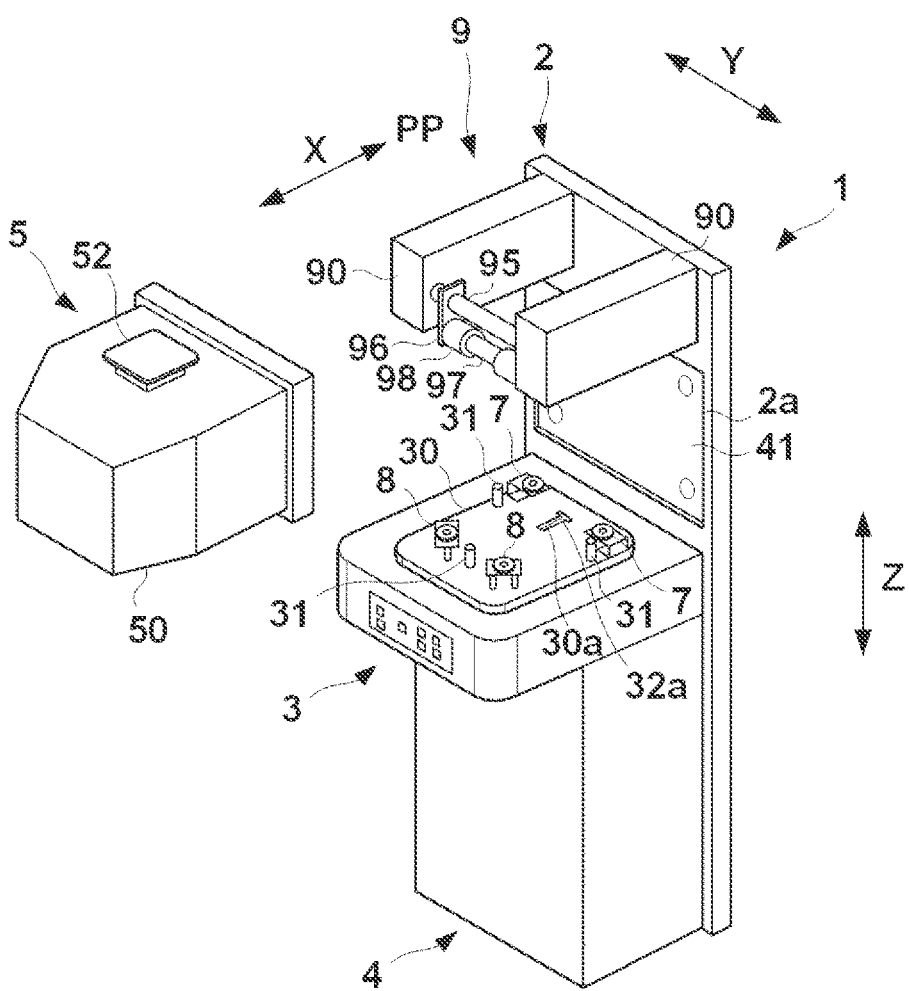
FIG. 1 is a view showing the outer appearance of a load port according to an embodiment of the present invention.

Hereinafter, embodiments will be described in detail with reference to the attached drawings. Note that the following embodiments are not intended to limit the scope of the claimed invention, and limitation is not made an invention that requires all combinations of features described in the embodiments. Two or more of the multiple features described in the embodiments may be combined as appropriate. Furthermore, the same reference numerals are given to the same or similar configurations, and redundant description thereof is omitted.

First Embodiment

<Outline of Apparatus>

Figure 2:
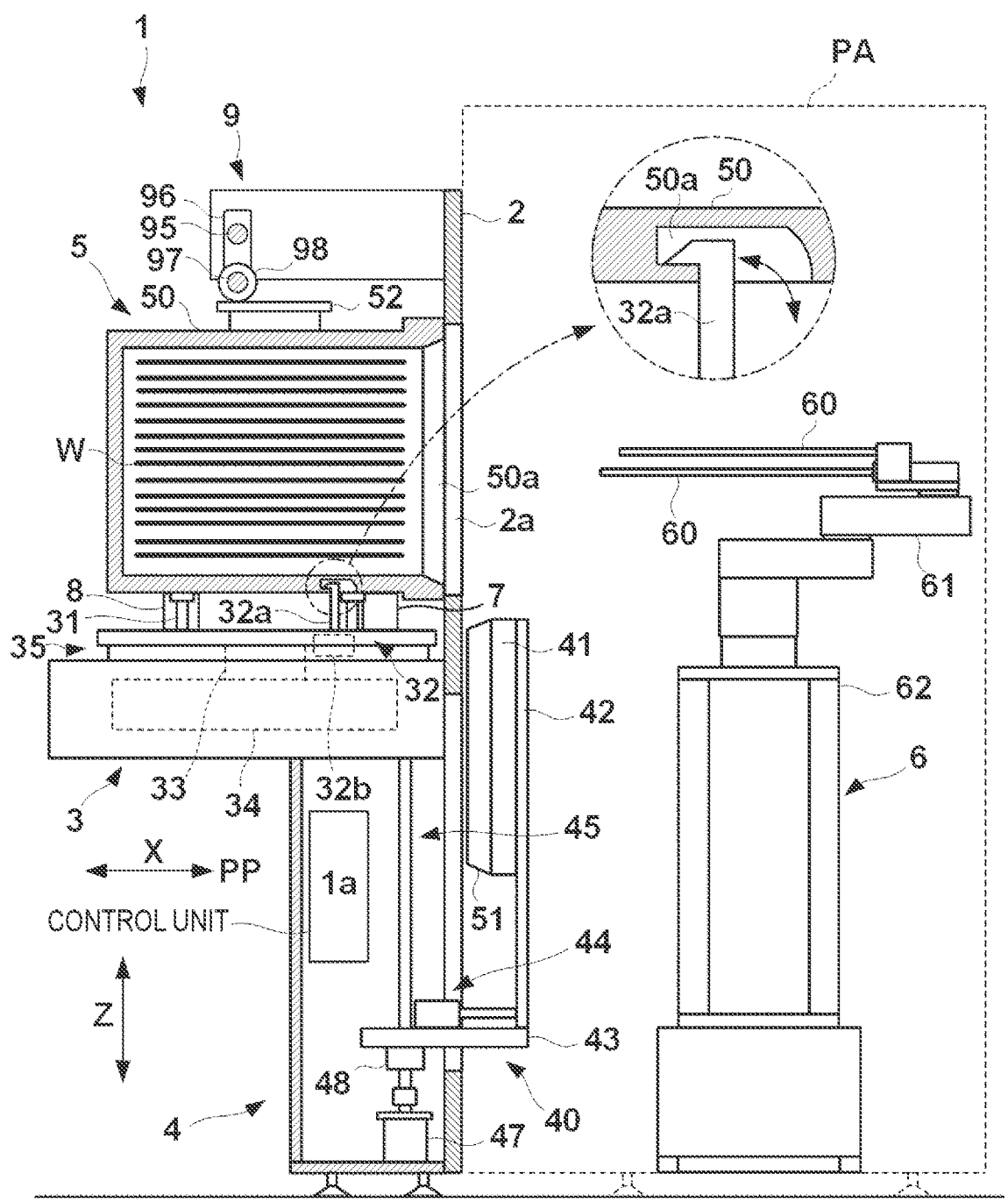
FIG. 2 is a view showing the internal mechanism and a use example of the load port shown in FIG. 1.

FIG. 1 is a view showing the outer appearance of a load port 1 according to an embodiment of the present invention. FIG. 2 shows a schematic sectional view and a partially enlarged view of the load port 1 in which a container is placed. In the drawings, arrows X and Y indicate horizontal directions orthogonal to each other, and an arrow Z indicates a vertical direction. In addition, of the X directions, PP represents the side of a port plate 2. The meanings of these arrows also apply to other drawings as well.

The load port 1 is an apparatus that opens/closes a container 5 such as a FOUP. The container 5 includes a box-shaped container main body 50 having, in a side portion, an opening portion 50a used to take in or out a substrate W such as a semiconductor wafer, and a lid (door) 51 that is detachably attached to the opening portion 50a and closes the opening portion 50a, and a handle 52 gripped by an overhead hoist transfer (OHT) in a semiconductor manufacturing factory. Note that FIG. 2 shows a state (open state) in which the lid 51 is removed from the container main body 50 by the load port 1, and a substrate conveying robot 6 can access the substrate W in the container 5.

The load port 1 includes the port plate 2, a placing table 3 on which the container 5 is placed, a support portion 4 that supports the placing table 3, and a pressing unit 9 supported on the upper portion of the port plate 2 and provided to the upper portion of the support portion 4. The port plate 2 is a plate-shaped wall body extending in the Z direction. The port plate 2 includes an opening portion 2a through which the removed lid 51 can pass in the X direction. At least one load port 1 is attached to a substrate conveying apparatus PA incorporating the substrate conveying robot 6 that conveys the substrate W. The substrate conveying robot 6 performs unloading and loading of the substrate W from and into the container 5 placed on the load port 1. The substrate conveying robot 6 includes an end effector 60 that holds the substrate W, an articulated arm 61 that holds the end effector 60 such that it can at least freely move forward and backward, and a driving unit 62 that makes the articulated arm 61 move forward/backward, turn, and move upward/downward. In the above-described open state, when the substrate conveying robot 6 is made to enter the container main body 50 opening to the side of the substrate conveying apparatus PA, unloading and loading of the substrate W are performed.

The placing table 3 includes a dock plate 30 on which the container 5 is placed. The dock plate 30 is provided with a plurality of positioning pins (kinematic pins) 31 that support the container 5 while positioning it, and presence sensors (not shown) configured to detect the presence of the container 5. The dock plate 30 is also provided with a lock mechanism 32 that locks the container 5 placed on the dock plate 30 to the dock plate 30. The lock mechanism 32 includes an engaging claw 32a, and a driving mechanism 32b that makes the engaging claw 32a pivot. The driving mechanism 32b is a mechanism that is fixed on the lower surface of the dock plate 30 and uses a motor, an electromagnetic solenoid, an air cylinder, or the like as a driving source. The engaging claw 32a passes through a slit 30a formed the dock plate 30 and pivots between a lock position where the engaging claw 32a appears on the dock plate 30 and a retreat position where the engaging claw 32a is stored in the slit 30a. At the lock position, the engaging claw 32a engages with an engaging groove 50a formed in the bottom portion of the container 5 and fixes the container 5 to the dock plate 30.

The dock plate 30 is also provided with an exhaust nozzle unit 7 and a gas supply nozzle unit 8. In this embodiment, two exhaust nozzle units 7 and two gas supply nozzle units 8 are provided. The exhaust nozzle unit 7 is a unit configured to exhaust an inert gas such as nitrogen gas from the container 5, and the gas supply nozzle unit 8 is a unit configured to supply an inert gas such as nitrogen gas to the container 5.

The exhaust nozzle unit 7 is a nozzle unit that is connected to an exhaust device (not shown) formed by an ejector or the like and sucks a gas. The exhaust nozzle unit 7 contacts an exhaust valve portion (not shown) provided on the bottom surface of the container 5 and exhausts a gas in the container 5 to the outside. The gas supply nozzle unit 8 is a nozzle unit that injects a gas (inert gas) of a positive pressure under a high pressure (or at a high speed) by a gas supply device (not shown). The gas supply nozzle unit 8 contacts an air supply valve portion (not shown) provided on the bottom surface of the container 5 and supplies a gas into the container 5. By the exhaust nozzle units 7 and the gas supply nozzle units 8, the atmosphere in the container 5 can be purged with the inert gas, and oxidation of the substrate W and entry of particles in the container 5 can be suppressed.

The placing table 3 incorporates a driving mechanism 33 that rotates the dock plate 30 about the Z axis, and a driving mechanism 34 that displaces the dock plate 30 in the X direction together with the driving mechanism 33. The driving mechanism 33 includes, for example, a driving source such as a motor or a rotary actuator, a support unit 35 that supports the dock plate 30, and a transmission mechanism such as a belt transmission mechanism or a gear mechanism that rotates the support unit 35 by the driving force of the driving source. The driving mechanism 34 includes a driving source such as an air cylinder, an electric cylinder, or a motor, the support unit 35 that supports the dock plate 30 together with the driving mechanism 33, and a transmission mechanism such as a cylinder mechanism, a ball screw mechanism, a cam mechanism, or a belt transmission mechanism that reciprocally moves the support unit 35 in the X direction by the driving force of the driving source.

The support portion 4 is a hollow body having a rectangular parallelepiped shape. The support portion 4 is provided with a mechanism 40 that moves a port door 41 that holds the lid 51 between a close position where the lid 51 closes the opening portion 50a, a retreat position where the lid 51 retreats through the opening portion 2a, and an open position (the position in the open state shown in FIG. 2) where the lid 51 retreats to the lower side of the lower edge of the opening portion 2a. The port door 41 includes, for example, a chucking mechanism, and the port door 41 can thus chuck and hold the lid 51. In addition, the port door 41 is provided with an operation mechanism (latch key) that operates opening/closing of a lock mechanism included in the lid 51. This can detach and attach the lid 51 from and to the container main body 50.

The port door 41 is supported by a connecting member 42 extending in the Z direction. The connecting member 42 is supported by a stage member 43 to be slidable in the X direction, and is moved in the X direction by an actuator 44 such as a ball screw or an electric cylinder. In addition, a ball nut 48 engaging with a ball screw shaft 45 extending in the vertical direction is fixed to the stage member 43. When the ball screw shaft 45 is rotated by a motor 47, the port door 41, the connecting member 42, and the stage member 43 integrally move upward or downward.

With the above-described structure, the port door 41 can be moved in the X direction and the Z direction. Hence, the lid 51 is moved between the closed position, the retreat position, and the open position. Note that the mechanism that moves the port door 41 is not limited to this, and various mechanisms can be employed.

The pressing unit 9 is a mechanism that is provided above the dock plate 30 and presses the container 5 placed on the dock plate 30 downward.

The load port 1 is provided with a control unit 1a. The control unit 1a includes, for example, a processing unit represented by a CPU, storage units such as a RAM and a ROM, an input/output interface between an external device and the processing unit, and a communication interface that performs communication with a computer such as a host computer or a peripheral device (the substrate conveying apparatus PA, the substrate conveying robot 6, or the like) via a communication line. The mechanisms of the load port 1, such as the pressing unit 9, the lock mechanism 32, and the driving mechanisms 33 and 34 are controlled by the control unit 1a.

Displacement Mode of Dock Plate

Figure 3C:
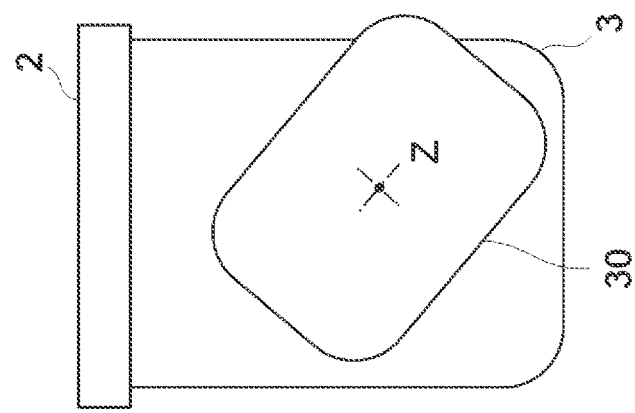
FIGS. 3A to 3C are views showing the displacement modes of a dock plate.
Figure 3B:
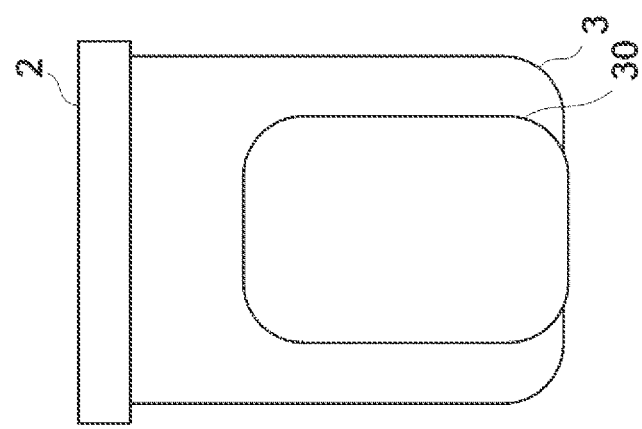
Figure 3A:
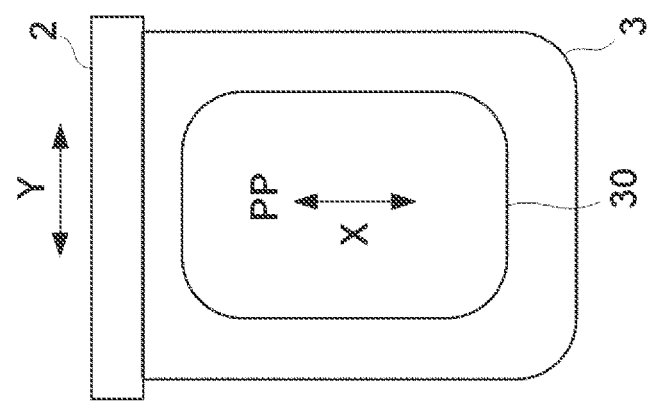

FIGS. 3A to 3C are views showing the displacement mode of the dock plate 30 by the driving mechanisms 33 and 34, and are plan views of the load port 1. In this embodiment, the dock plate 30 can be rotated about the axis in the Z direction and moved in the X direction by the driving mechanisms 33 and 34.

FIG. 3A shows a state in which the dock plate 30 is located at a position (to be also referred to as dock position hereinafter) closest to the PP side in the X direction with respect to the port plate 2. Opening/closing of the container 5 is performed at the dock position. FIG. 3B shows a state in which the dock plate 30 is located at a position (to be also referred to as a transfer position hereinafter) farthest from the port plate 2. When automatically transferring the container 5 using a container conveying robot (not shown) between the load port 1 and a container storage (stocker) that stocks a plurality of containers 5, the transfer is performed at the transfer position. In addition, when an operator manually places the container 5 on the dock plate 30 or manually unloads the placed container 5, the operation is performed at the transfer position.

FIG. 3C shows a state in which the dock plate 30 is rotated halfway. In this embodiment, the dock plate 30 can rotate about the Z axis at an arbitrary position in the X direction. Here, at the transfer position, the container conveying robot (or the operator) located on the side (on the lower side in FIG. 3B) opposite to the PP side in the X direction sometimes places, on the dock plate 30, the container 5 with the lid 51 facing the side of the container conveying robot (or the operator). At this time, when the dock plate 30 is rotated by the driving mechanism 33, the direction of the dock plate 30, that is, the direction of the container 5 can be reversed. The lid 51 thus faces the side of the port plate 2 (the PP side in the X direction). After that, the dock plate 30 is moved to the dock position in FIG. 3A. In the following description, of the rotation positions of the dock plate 30, the position where the lid 51 faces the side of the port plate 2, as shown in FIG. 2, will be referred to as an operation position, and a position where the lid 51 faces the opposite side will be referred to as a preparation position. At the operation position, the exhaust nozzle units 7 of the dock plate 30 are located near the port plate 2, as shown in FIG. 1 or 2. At the preparation position, conversely, the gas supply nozzle units 8 are located near the port plate 2.

Gas Supply Nozzle Unit

Figure 4C:
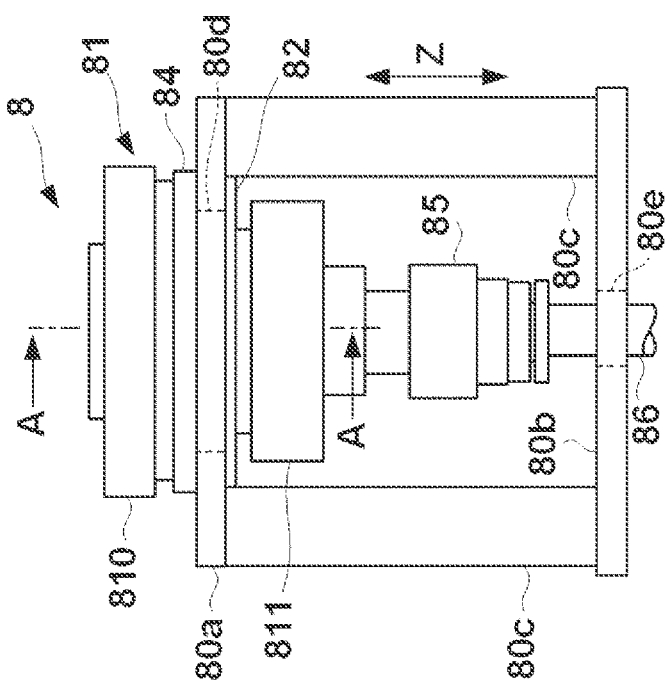
FIGS. 4A to 4C are a plan view, a front view, and a side view of a nozzle unit.
Figure 4A:
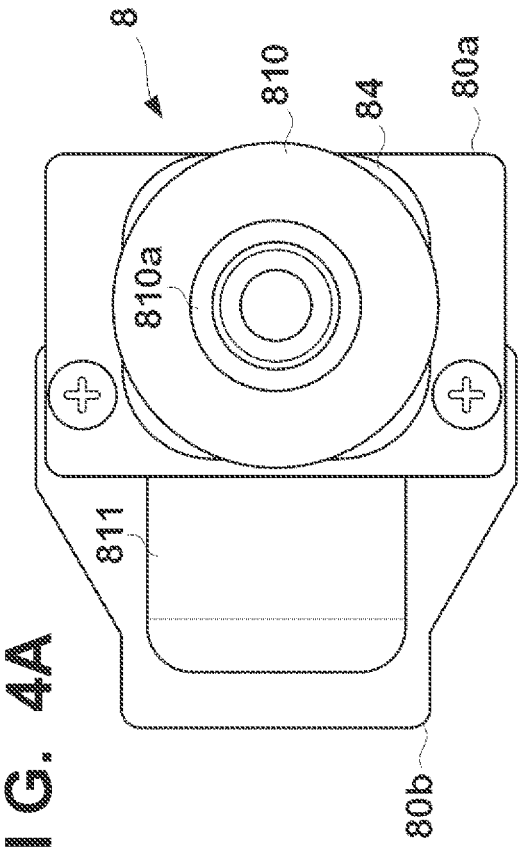
Figure 4B:
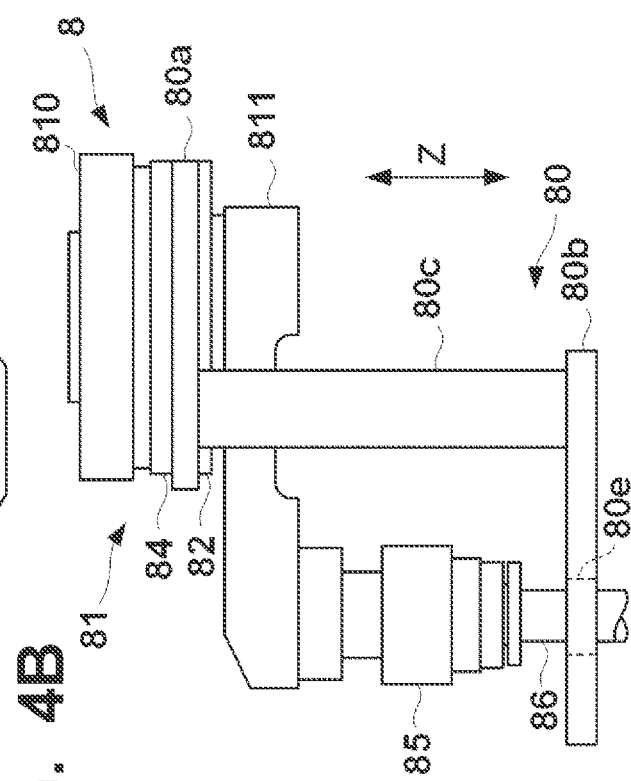
Figure 5:
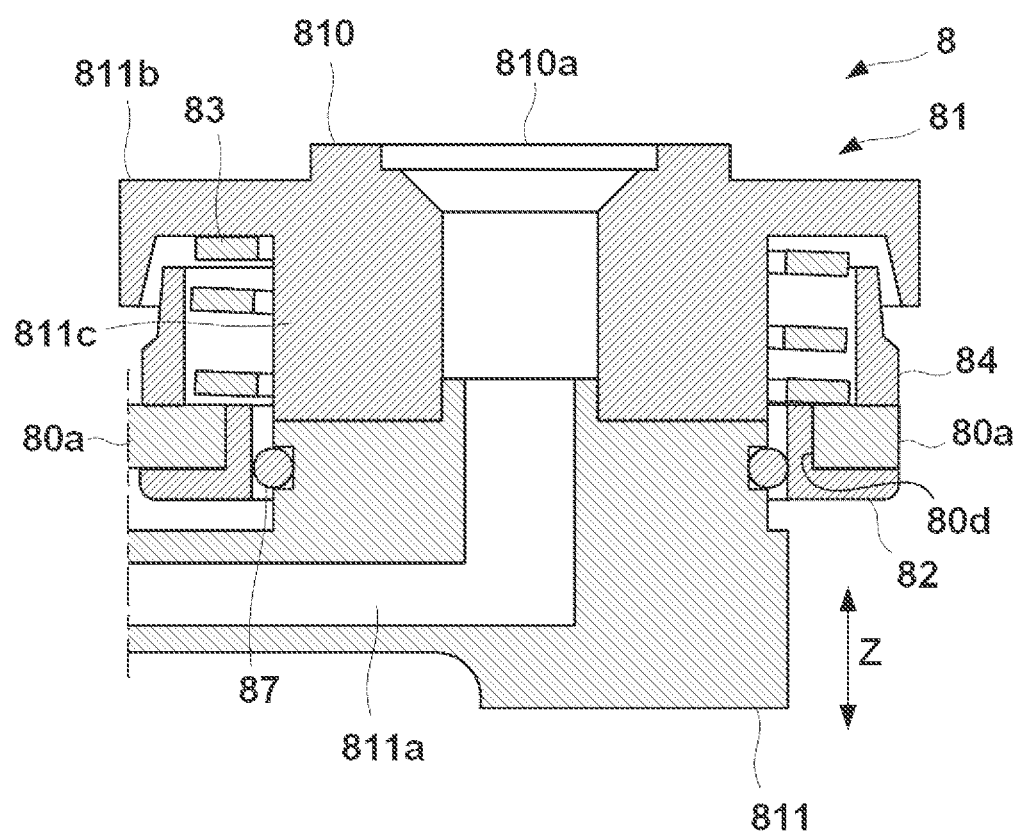
FIG. 5 is a sectional view taken along a line A-A in FIG. 4C.

The structure of the gas supply nozzle unit 8 will be described with reference to FIGS. 4A to 4C and 5. FIGS. 4A to 4C are a plan view, a front view, and a side view of the gas supply nozzle unit 8. FIG. 5 is a sectional view taken along a line A-A in FIG. 4C. Note that the exhaust nozzle unit 7 have a structure similar to the gas supply nozzle unit 8, although not particularly explained.

The gas supply nozzle unit 8 includes a nozzle support body 80, a nozzle 81, a bush 82, an elastic member 83, and a cover 84. The nozzle support body 80 is a member that fixes the gas supply nozzle unit 8 to the dock plate 30, and is a frame body that supports the nozzle 81 such that is can move in the vertical direction. The nozzle support body 80 includes a base plate 80b fixed to the dock plate 30, two columns 80c standing on the base plate 80b, and a support plate 80a fixed to the upper end portions of the two columns 80c. As the elastic member 83, a member with a strong elastic force is employed because of a reason to be described later. To prevent distortion caused by the elastic force of the elastic member 83, the gas supply nozzle unit 8 has a structure formed by connecting the support plate 80a and the base plate 80b by the two strong columns 80c instead of using plane-shaped members such as the support plate 80a and the base plate 80b.

An opening portion 80e that passes a pipe 86 configured to supply a compressed gas is formed in the base plate 80b. Note that an opening portion (not shown) that passes the pipe 86 is formed in the dock plate 30 as well. The column 80c is a cylindrical body extending in the Z direction, and has its lower end portion fixed to the base plate 80b by a screw and its upper end portion fixed to the support plate 80a by a screw. An opening portion 80d through which the nozzle 81 passes is formed in the support plate 80a. The bush 82 interposed between the nozzle 81 and the support plate 80a is fitted in the opening portion 80d.

The nozzle 81 includes a nozzle main body 810 on the upper side, and a passage forming member 811 on the lower side. The nozzle main body 810 has a cylindrical shape as a whole, and includes a cylindrical body portion 811c, and a flange portion 811b projecting in the radial direction from the upper portion of the body portion 811c. An air supply hole 810a is formed at the center of the nozzle main body 810. A gas supplied to the gas supply nozzle unit 8 is injected upward from the air supply hole 810a. The upper surface of the nozzle main body 810 contacts the air supply valve portion (not shown) provided on the bottom surface of the container 5, and the gas is injected from the air supply hole 810a into the container 5.

The passage forming member 811 is an L-shaped member fixed to the lower end portion of the nozzle main body 810, and forms a gas passage 811a communicating with the air supply hole 810a. The passage 811a communicates with the pipe 86 connected to the passage forming member 811 via a connector 85. A ring-shaped slide contact member 87 that slidably contacts the inner peripheral wall of the bush 82 is provided in the passage forming member 811. The nozzle 81 is not fixed to the nozzle support body 80, and is supported via the slide contact member 87 and the bush 82 to be movable in the Z direction with respect to the nozzle support body 80.

In this embodiment, the elastic member 83 is a coil spring in which the body portion 811c is inserted, and is provided between the flange portion 811b and the support plate 80a. The cover 84 is a cylindrical body surrounding the periphery of the elastic member 83. The elastic member 83 always biases the nozzle 81 upward. That is, by the biasing force of the elastic member 83, the upper surface of the nozzle main body 810 is pressed against the air supply valve portion (not shown) provided on the bottom surface of the container 5. When the elastic member 83 is provided, the contact followability of the nozzle 81 to the bottom surface of the container 5 can be improved, and leakage of the gas at the time of gas supply can be prevented.

The nozzle 81 can move in the vertical direction within a predetermined range in the Z direction. FIG. 5 shows a state in which the nozzle 81 is located at the upper limit position. The lower limit position of the nozzle 81 is the position where the flange portion 811b contacts the cover 84. In this embodiment, a coil spring is used as the elastic member 83. However, another elastic member of rubber or the like may be used.

Pressing Unit

Figure 6A:
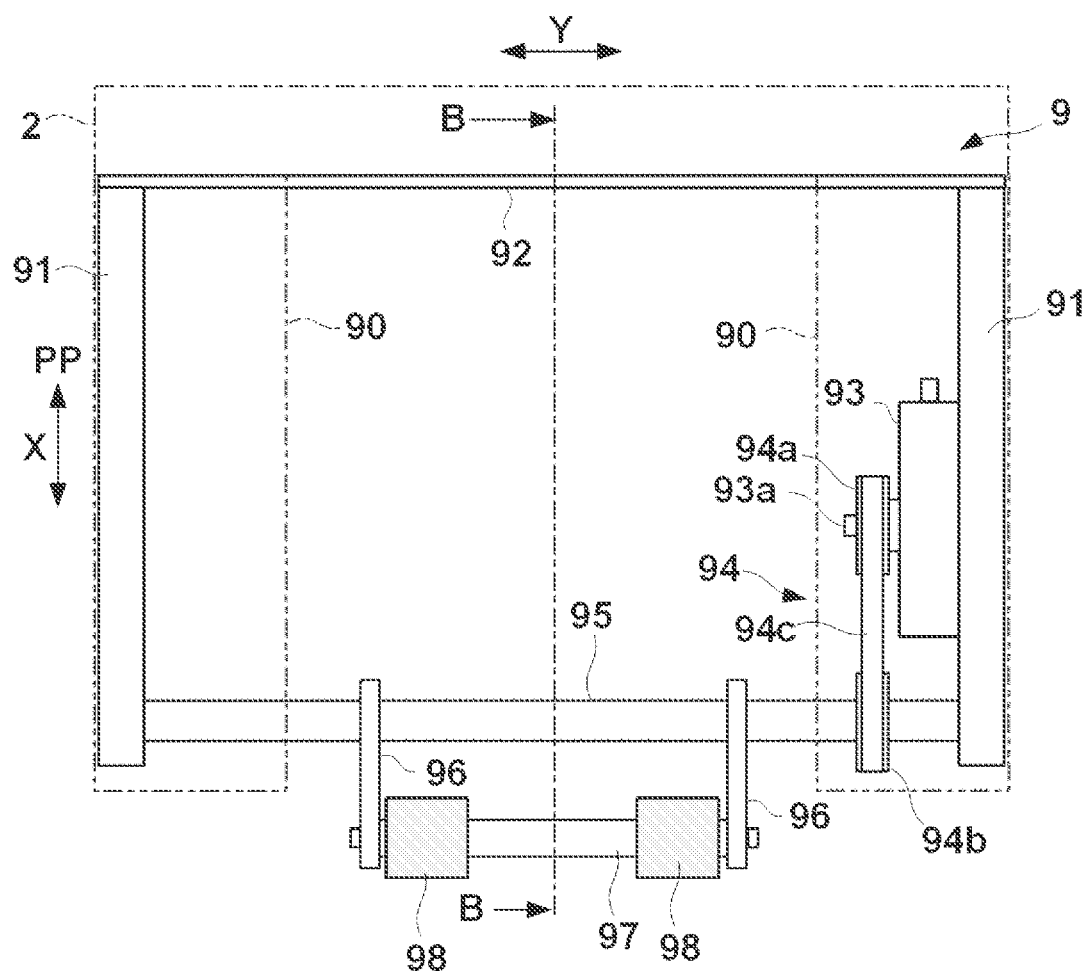
FIG. 6A is an explanatory view of a pressing unit.
Figure 6B:
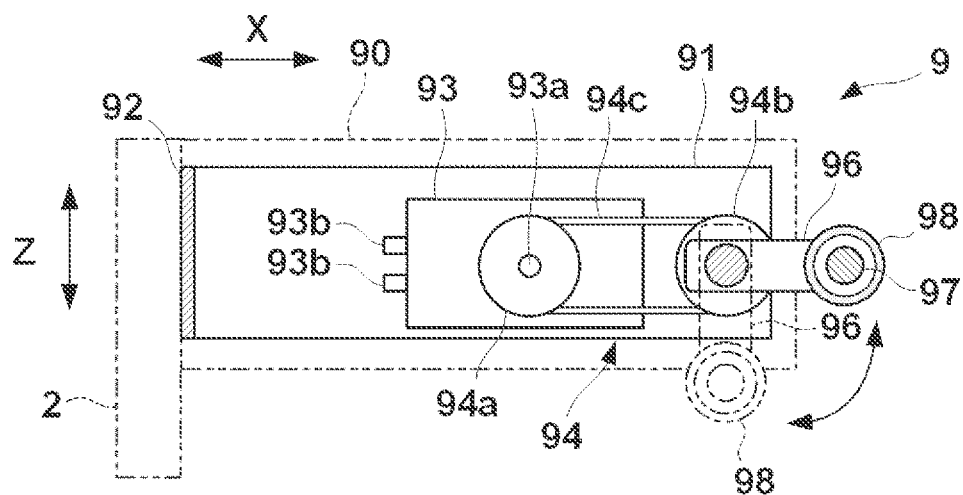
FIG. 6B is a sectional view taken along a line B-B in FIG. 6A.

The structure of the pressing unit 9 will be described with reference to FIGS. 6A and 6B. FIG. 6A is an explanatory view of the pressing unit 9 and corresponds to a plan view. FIG. 6B is a sectional view taken along a line B-B in FIG. 6A. The pressing unit 9 is a unit that moves a contact member 98 between a position apart from the container 5 and a position in contact with the container 5 by a driving mechanism using a rotation driving unit 93 as a driving source.

The pressing unit 9 includes a pair of frames 91 apart in the Y direction. Each frame 91 extends in the X direction, and its periphery is surrounded by a cover 90. Also, the end portions of the pair of frames 91 on the PP side in the X direction are connected by a connecting member 92 extending in the Y direction, and the connecting member 92 is fixed to the port plate 2.

A pivot shaft 95 is rotatably supported between the pair of frames 91 on the side (on the lower side in FIG. 6A) opposite to the PP side in the X direction. The pivot shaft 95 is a rod member extending in the Y direction and having a circular section. The rotation driving unit 93 is supported on the surface, on the facing side, of one of the frames 91 facing each other. In this embodiment, the rotation driving unit 93 is a pneumatic rotary actuator. When air is supplied to one of a pair of air supply/exhaust ports 93b, an output shaft 93a rotates by a predetermined angle, for example, 90°.

The rotation of the rotation driving unit 93 is transmitted to the pivot shaft 95 via a transmission mechanism 94. That is, the transmission mechanism 94 is a mechanism that transmits the output of the rotation driving unit 93 to the pivot shaft 95. In this embodiment, the transmission mechanism 94 is a belt transmission mechanism. However, it may be another transmission mechanism such as a gear mechanism. The transmission mechanism 94 includes a pulley 94a attached to the output shaft 93a, a pulley 94b attached to the peripheral surface of the pivot shaft 95, and a timing belt 94c wound around the pulleys 94a and 94b. By the transmission mechanism 94, the rotation of the output shaft 93a is transmitted to the pivot shaft 95, and the pivot shaft 95 pivots.

One or a plurality of contact members 98 are supported by the pivot shaft 95 via a pair of arm members 96. As the pair of arm members 96, two arm members are provided on the peripheral surface of the pivot shaft 95 while being apart in the Y direction. The base side of each arm member 96 is fixed to the pivot shaft 95, and a roller shaft 97 is fixed to the distal end side of each arm member 96. One or a plurality of contact members 98 are provided on the peripheral surface of the roller shaft 97. In this embodiment, the contact member 98 is a roller member rotatably provided on the peripheral surface of the roller shaft 97, and two contact members 98 are provided apart in the Y direction.

When the pivot shaft 95 pivots, the pair of arm members 96 turn by 90° between an almost horizontal state and an almost vertical downward state, and the roller shaft 97 and the contact members 98 swing. The contact members 98 swing between a retreat position (almost horizontal state) indicated by solid lines in FIG. 6B and a pressing position (almost vertical downward state) indicated by alternate long and two short dashed lines. As shown in FIG. 2 and the like, at the pressing position, the contact members 98 contact the upper surface of the container 5 placed on the dock plate 30 and press the container 5 downward. In this embodiment, the contact members 98 contact the handle 52 on the upper surface of the container 5. However, these may contact other parts of the upper surface of the container main body 50 or parts other than the upper surface of the container 5, for example, both side surfaces.

In this embodiment, the contact members 98 are supported apart from the pivot shaft 95 by the length of the arm members 96, more strictly, the inter-axial distance between the pivot shaft 95 and the roller shaft 97. For this reason, since the contact members 98 are apart from the pivot shaft 95 by the above-described inter-axial distance, the moment of the force of the contact members 98 becomes large when the pivot shaft 95 is made to pivot. As a result, even if the rotation driving unit 93 of a relatively low output is used, the contact members 98 can press the container 5 by a sufficient force.

Figure 7A:
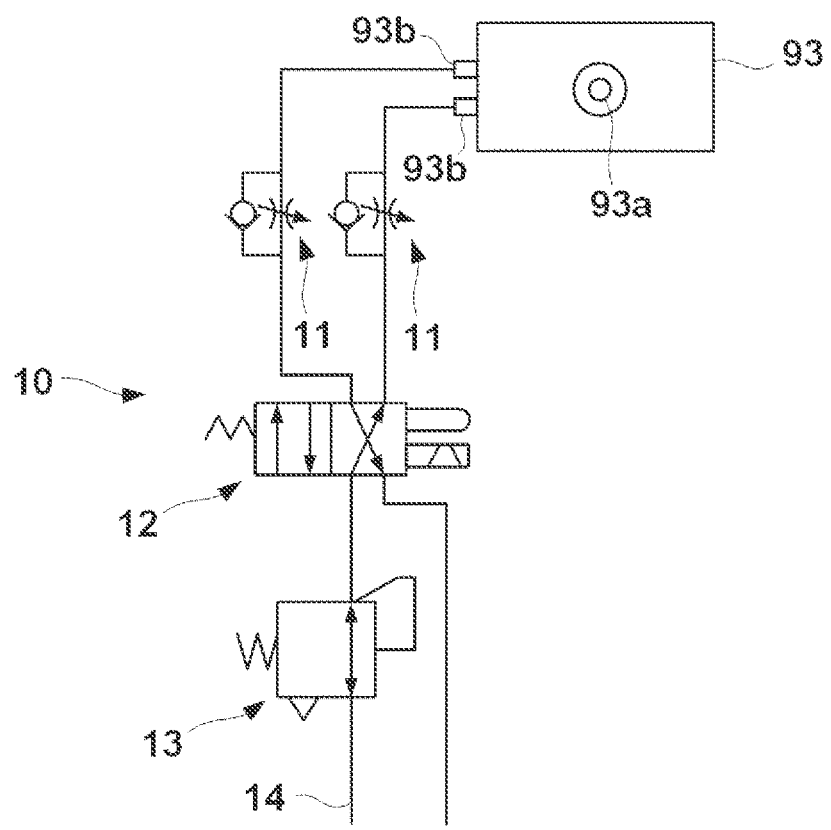
FIG. 7A is a view showing the pneumatic circuit of the pressing unit.

FIG. 7A is a circuit diagram showing an example of a pneumatic circuit 10 that drives the rotation driving unit 93. Air from a compressor (not shown) is supplied to a solenoid valve 12 via a pipe 14 after the pressure is adjusted by a pressure reducing valve 13. The solenoid valve 12 is a direction switching valve configured to switch the air supply path, and its air supply/exhaust port is connected to the pair of air supply/exhaust ports 93b via speed controllers 11. The speed controller 11 is a flow control valve.

A port for supplying air is switched between the pair of air supply/exhaust ports 93b by the solenoid valve 12, thereby changing the rotation direction of the output shaft 93a. Switching control of the solenoid valve 12 is done by the control unit 1a. In addition, the air pressure to the rotation driving unit 93 is adjusted by the pressure reducing valve 13, thereby adjusting the output torque. That is, the downward pressing force of the contact members 98 to the container 5 can be adjusted.

Figure 7B:
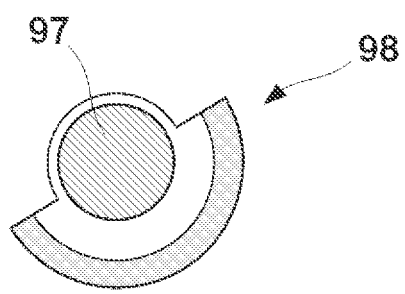
FIG. 7B is a sectional view showing another example of the shape of a contact member.

Note that the contact member 98 may be not a roller member having a circular section but a roller member having a semicircular section, as shown in FIG. 7B, and the angle range of the outer periphery may be an angle range other than 360° (circle) and 180° (semicircle). In addition, the contact member 98 may unrotatably be fixed to the roller shaft 97. Also, the contact member 98 may be not a roller member but a sphere or a hemisphere, and may have a form that comes into point or line contact with the container 5.

Control Example

A control example of the load port 1 by the control unit 1a will be described with reference to FIGS. 8A to 10C. FIGS. 8A to 10C show an example of the operation of the load port 1 from loading of the container 5 to immediately before opening of the lid 51. FIG. 8A shows a preparation state before loading of the container 5. The contact members 98 are located at the retreat position. The dock plate 30 is located at an undock position on the side opposite to the PP side in the X direction, and is located at the preparation position concerning the rotation direction.

FIG. 8B shows a state in which the container 5 is placed on the dock plate 30. This is an example in which the container 5 is placed with the lid 51 facing the side opposite to the PP side in the X direction. The container 5 is placed on the positioning pins 31 while engaging with these, so that positioning in the X, Y, and Z directions is performed. At this time, the gas supply nozzle units 8 and the exhaust nozzle units 7 are brought into contact with the purge ports on the bottom surface of the container 5.

In this state, first, the contact members 98 of the pressing unit 9 are made to swing to the pressing position. As shown in FIG. 9A, the contact members 98 contact the handle 52 of the container 5, and the container 5 is pressed downward (against the dock plate 30). Next, as shown in FIG. 9B, the lock mechanism 32 is driven to make the engaging claw 32a pivot to the lock position. This can fix the container 5 to the dock plate 30.

In some cases, a gas is injected from the gas supply nozzle units 8 into the container 5 or perform purge (prepurge). To suppress leakage of the gas from the gap between the gas supply nozzle units 8 and the container 5 at this time, a member having a strong elastic force (a strong force of biasing the nozzle 81 upward) is sometimes employed as the elastic member 83 that biases the gas supply nozzle units 8 against the container 5. However, if the elastic force of the elastic member 83 is simply increased, the container 5 placed on the dock plate 30 may float up from the positioning pins 31 somewhat. If the lock mechanism 32 is operated in the state in which the container 5 floats, the engaging claw 32a may idle without engaging with the engaging groove 50a. In this embodiment, the lock mechanism 32 is operated in a state in which the container 5 is pressed downward by the pressing unit 9, thereby eliminating the possibility that the engaging claw 32a idles. As a result, the engaging claw 32a reliably engages with the engaging groove 50a, and the container 5 can reliably be locked.

Note that depending on the supply flow velocity or supply pressure of the gas in prepurge, leakage of the gas from the gap between the gas supply nozzle units 8 and the container 5 can be suppressed only by the function of bringing the nozzles 81 of the gas supply nozzle units 8 into contact with the purge ports on the bottom surface of the container 5 by the lock mechanism 32 and the elastic member 83 without pressing of the container 5 by the pressing unit 9. In this case, the pressing unit 9 need not be driven in prepurge.

As for the timing of performing prepurge, the prepurge may be executed at any timing during the period from the starting point set immediately after the container 5 is locked to the point after the container 5 moves from the undock position to the dock position and immediately before the start of main purge at the dock position. Alternatively, the prepurge may be executed during the whole period from the starting point set immediately after the container 5 is locked to the point after the container 5 moves from the undock position to the dock position and immediately before the start of main purge at the dock position. When prepurge is performed, an inert gas can be supplied into the container 5 in advance, and therefore, the time needed for the main purge can be shortened.

Next, as shown in FIG. 9C, the contact members 98 of the pressing unit 9 are made to swing to the retreat position and separated from the handle 52. This temporarily cancels pressing of the container 5 downward. After that, as shown in FIG. 10A, the driving mechanism 33 is driven to rotate the dock plate 30 to the operation position. Hence, the direction of the container 5 is reversed, and a posture in which the lid 51 faces the side of the port plate 2 (the PP side in the X direction) is obtained. Next, the driving mechanism 34 is driven to move the dock plate 30 to the dock position, as shown in FIG. 10B.

As shown in FIG. 10C, the contact members 98 of the pressing unit 9 are made to swing to the pressing position again. The contact members 98 contact the handle 52 of the container 5 again, and the container 5 is pressed downward (against the dock plate 30). After that, the lid portion 51 is opened by the port door 41. A gas is supplied from the gas supply nozzle units 8 into the container 5, and the gas in the container 5 is exhausted from the exhaust nozzle units 7, thereby performing purge (main purge) of the atmosphere in the container 5.

When performing main purge, to complete the purge in a shorter time, the gas supply amount per unit time is increased as compared to prepurge, that is, the supply flow velocity is increased, or the supply pressure is made high in some cases. At this time, only by the function of bringing the nozzles 81 of the gas supply nozzle units 8 into contact with the purge ports on the bottom surface of the container 5 by the lock mechanism 32 and the elastic member 83, the container 5 may largely float up from the gas supply nozzle units 8, and it may be impossible to suppress leakage of the gas at the time of purge. To prevent the container 5 from floating, the container 5 is reliably pressed downward (against the dock plate 30) by the pressing unit 9, thereby eliminating the floating and suppressing leakage of the gas at the time of purge.

Even in a case in which main purge is not performed at the dock position, when the elastic force of the elastic member 83 is strong, the container 5 may slightly float up from the positioning pins 31. If the slight floating exceeds an allowable range, a hindrance may occur in subsequent processing because, for example, the substrate W cannot appropriately be transferred by the end effector 60 of the substrate conveying robot 6. Hence, when the container 5 is pressed downward (against the dock plate 30) by the pressing unit 9 to eliminate floating of the container 5 from the positioning pins 31, the hindrance can be prevented from occurring.

With the above-described processing, when the container 5 is pressed downward (against the dock plate 30) by the pressing unit 9 even at the dock position, floating of the container 5 from the gas supply nozzle units 8, that is, leakage of the gas can reliably be prevented, and therefore, purge in the container 5 can be completed in a shorter time. In addition, since the container 5 is pressed downward by the pressing unit 9, floating of the container 5 can be eliminated, and a hindrance that the substrate W cannot appropriately be transferred by the end effector 60 of the substrate conveying robot 6 can be prevented from occurring.

Note that the timing of purging the atmosphere in the container 5 is not limited to the timing after the lid portion 51 is completely opened (the position in the open state shown in FIG. 2). The position may be the closed position where the lid portion 51 closes the opening portion 50a, and the timing may be the timing when the lid portion 51 is located at a position between the closed position and the open state, that is, the timing from the start of opening of the lid portion 51 until the lid portion 51 is completely opened.

Since the contact members 98 can freely separate from or contact the container 5, the contact members 98 can be placed apart from the container 5 during the movement of the container 5, as in the control example. This can reduce the wear of the contact portions between the contact members 98 and the container 5 and also suppress generation of particles. In addition, when the contact members 98 contacts the handle 52 of the container 5, the contact members 98 can press the handle 52 downward by a smaller force because the contact members 98 are rotatable roller members.

Second Embodiment

Figure 11A:
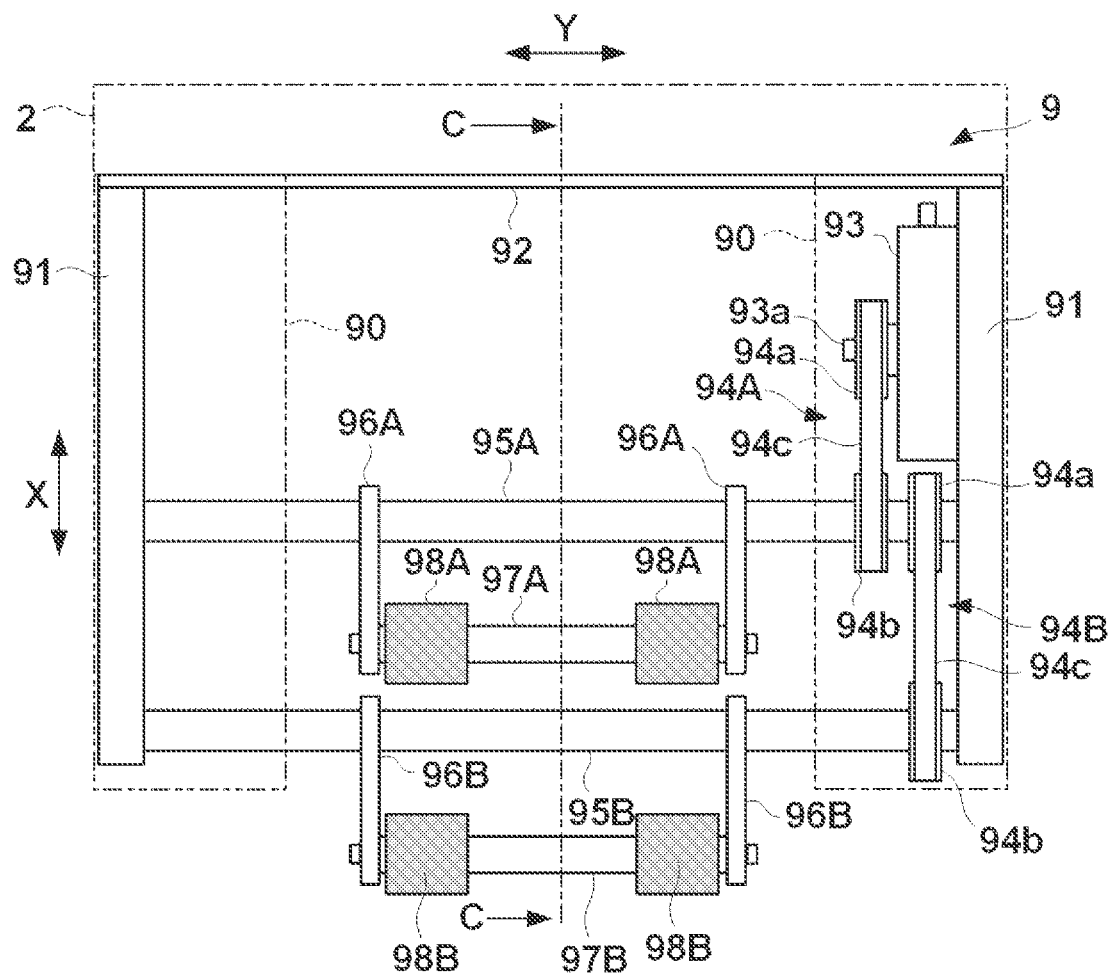
FIG. 11A is an explanatory view of another example of the arrangement of the pressing unit.
Figure 11B:
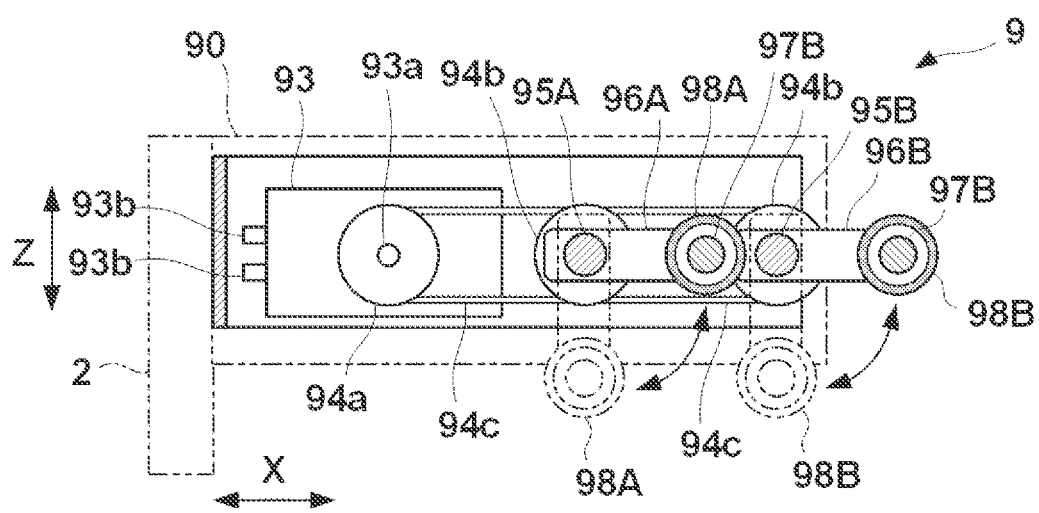
FIG. 11B is a sectional view taken along a line C-C in FIG. 11A.

When automatically transferring a container 5 using a container conveying robot between a load port 1 and a container storage (stocker) (not shown) that stocks a plurality of containers 5, the transfer position may change, and therefore, the moving stroke between the dock position and the undock position may change. To make pressing of the container 5 by a pressing unit 9 more reliable, the pressing unit 9 may include one or a plurality of contact members 98 apart in the X direction. FIG. 11A is an explanatory view of the pressing unit 9 according to this embodiment and corresponds to a plan view. FIG. 11B is a sectional view taken along a line C-C in FIG. 11A. The pressing unit 9 according to this embodiment includes two sets of transmission mechanisms 94, pivot shafts 95, pairs of arm members 96, roller shafts 97, and contact members 98. Concerning the pressing unit 9 according to this embodiment, an arrangement different from the pressing unit 9 according to the first embodiment will be described below.

The pressing unit 9 includes a set of a transmission mechanism 94A, a pivot shaft 95A, a pair of arm members 96A, a roller shaft 97A, and a contact member 98A, and a set of a transmission mechanism 94B, a pivot shaft 95B, a pair of arm members 96B, a roller shaft 97B, and a contact member 98B. The pivot shaft 95A and the pivot shaft 95B are arranged apart in the X direction in parallel to each other and rotatably supported by a pair of frames 91.

The transmission mechanism 94A is a mechanism that transmits the output of a rotation driving unit 93 to the pivot shaft 95A, and includes a pulley 94a attached to an output shaft 93a, a pulley 94b attached to the pivot shaft 95A, and a timing belt 94c wound around the pulleys 94a and 94b. By the transmission mechanism 94A, when the output shaft 93a rotates, the pivot shaft 95A pivots about its axis.

The transmission mechanism 94B is a mechanism that transmits the output of the rotation driving unit 93 to the pivot shaft 95B via the pivot shaft 95A, and includes the pulley 94a attached to the pivot shaft 95A, the pulley 94b attached to the pivot shaft 95B, and the timing belt 94c wound around the pulleys 94a and 94b. By the transmission mechanism 94B, when the output shaft 93a rotates, the pivot shaft 95B pivots about its axis. In this embodiment, each of the transmission mechanisms 94A and 94B is a belt transmission mechanism. However, it may be another transmission mechanism such as a gear mechanism.

One or a plurality of contact members 98A are supported by the pivot shaft 95A via the pair of arm members 96A. As the pair of arm members 96A, two arm members are provided on the peripheral surface of the pivot shaft 95A while being apart in the Y direction. The base side of each arm member 96A is fixed to the pivot shaft 95A, and the roller shaft 97A is fixed to the distal end side of each arm member 96A. One or a plurality of contact members 98A are provided on the peripheral surface of the roller shaft 97A. In this embodiment, the contact member 98A is a roller member rotatably provided on the peripheral surface of the roller shaft 97A, and two contact members 98A are provided apart in the Y direction. When the pivot shaft 95A pivots, the pair of arm members 96A turn by 90° between an almost horizontal state and an almost vertical downward state, and the roller shaft 97A and the contact members 98A swing.

One or a plurality of contact members 98B are supported by the pivot shaft 95B via the pair of arm members 96B. As the pair of arm members 96B, two arm members are provided on the peripheral surface of the pivot shaft 95B while being apart in the Y direction. The base side of each arm member 96B is fixed to the pivot shaft 95B, and the roller shaft 97B is fixed to the distal end side of each arm member 96B. One or a plurality of contact members 98B are provided on the peripheral surface of the roller shaft 97B. In this embodiment, the contact member 98B is a roller member rotatably provided on the peripheral surface of the roller shaft 97B, and two contact members 98B are provided apart in the Y direction. When the pivot shaft 95B pivots, the pair of arm members 96B turn by 90° between an almost horizontal state and an almost vertical downward state, and the roller shaft 97B and the contact members 98B swing.

The contact members 98A and the contact members 98B are apart from each other in the X direction. By driving of the rotation driving unit 93, the contact members 98A and the contact members 98B synchronously swing between a retreat position (almost horizontal state) indicated by solid lines in FIG. 11B and a pressing position (almost vertical downward state) indicated by alternate long and two short dashed lines. As shown in FIG. 13 and the like, at the pressing position, the contact members 98A and the contact members 98B contact the upper surface of the container 5 placed on a dock plate 30 and press the container 5 downward. In this embodiment, the contact members 98A and the contact members 98B contact a handle 52 on the upper surface of the container 5. However, these may contact other parts of the upper surface of the container main body 50 or parts other than the upper surface of the container 5, for example, both side surfaces.

Control Example

Figure 12A:
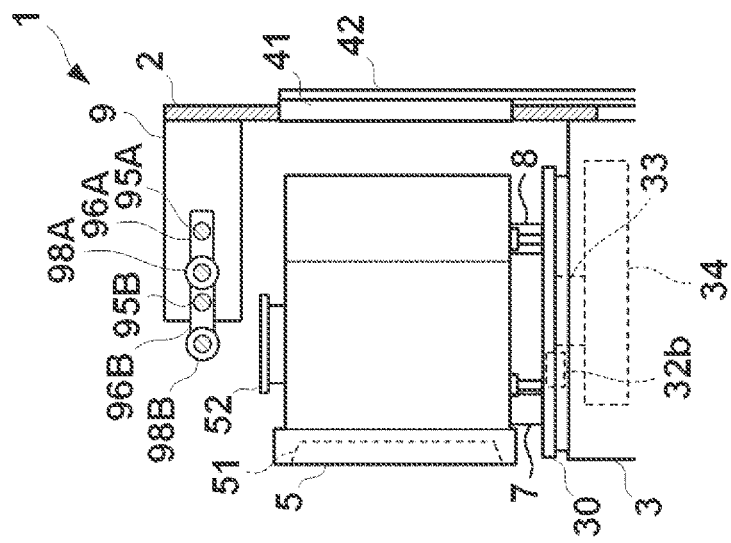
FIGS. 12A and 12B are explanatory views of the operation of the load port using the pressing unit shown in FIG. 11A.
Figure 14A:
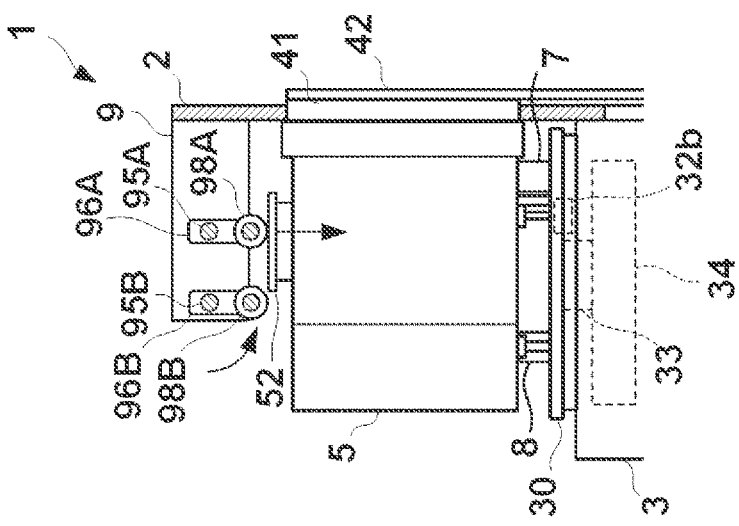
FIGS. 14A to 14C are explanatory views of the operation of the load port using the pressing unit shown in FIG. 11A.
Figure 14B:
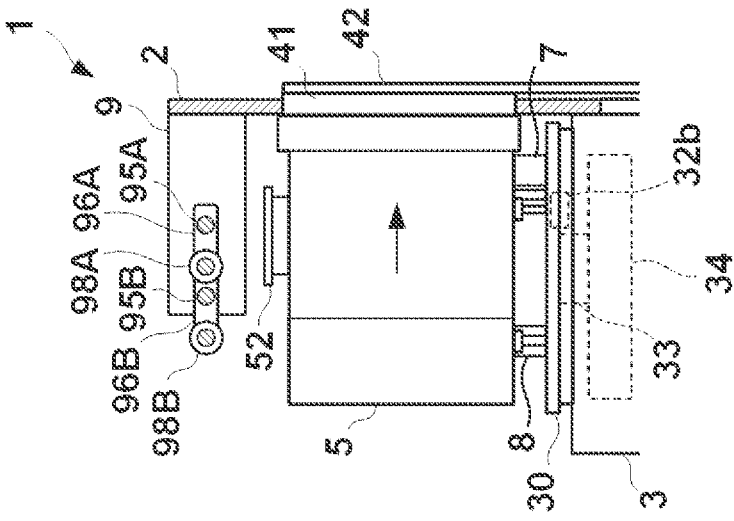
Figure 14C:
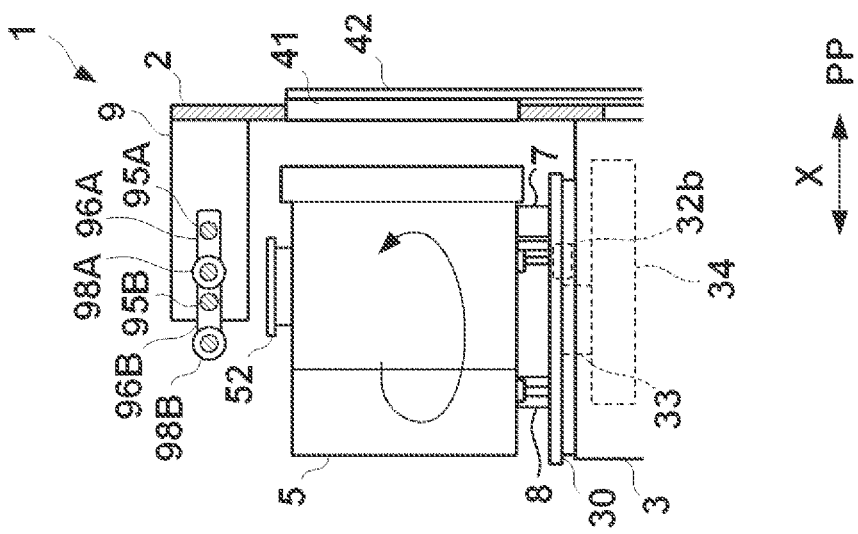

A control example of the load port 1 by a control unit 1a will be described with reference to FIGS. 12A 14C. FIGS. 12A to 14C show an example of the operation of the load port 1 according to this embodiment from loading of the container 5 to immediately before opening of a lid 51, as in the example shown in FIGS. 8A to 10C. FIG. 12A shows a preparation state before loading of the container 5. The contact members 98A and 98B are located at the retreat position. The dock plate 30 is located at an undock position on the side opposite to the PP side in the X direction, and is located at the preparation position concerning the rotation direction.

Figure 12B:
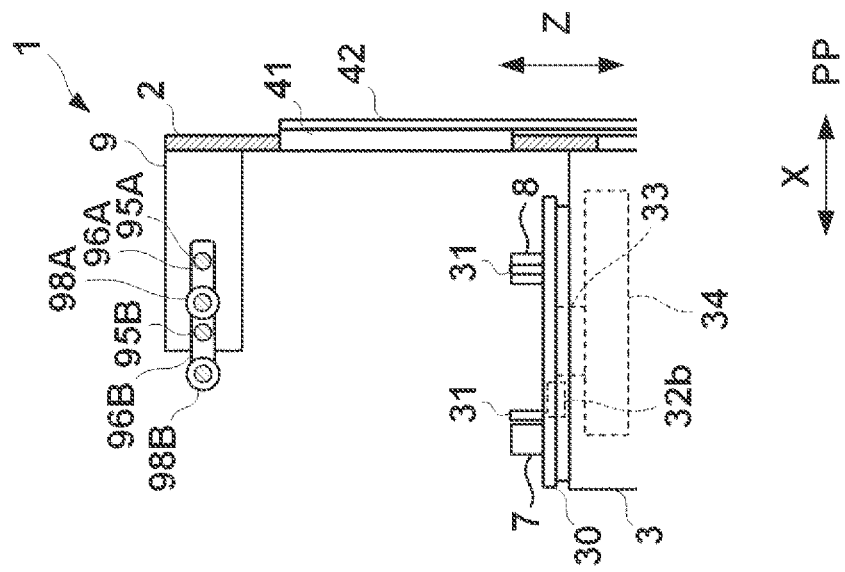

FIG. 12B shows a state in which the container 5 is placed on the dock plate 30. This is an example in which the container 5 is placed with the lid 51 facing the side opposite to the PP side in the X direction. The container 5 is placed on positioning pins 31 while engaging with these, so that positioning in the X, Y, and Z directions is performed. At this time, gas supply nozzle units 8 and exhaust nozzle units 7 are brought into contact with purge ports on the bottom surface of the container 5.

In this state, first, the contact members 98A and 98B of the pressing unit 9 are made to swing to the pressing position. As shown in FIG. 13A, the contact members 98B contact the handle 52 of the container 5, and the container 5 is pressed downward (against the dock plate 30). At this time, the contact members 98A are not in contact with the container 5 because of the moving stroke difference between the dock position and the undock position generated by the difference of the transfer position of the container 5. However, since the contact members 98B are in contact with the container 5, the pressing of the container 5 downward is sufficient. Next, as shown in FIG. 13B, a lock mechanism 32 is driven to make an engaging claw 32a pivot to the lock position. This can fix the container 5 to the dock plate 30.

In this embodiment, two sets of contact members 98A and 98B are provided in the pressing unit 9. Hence, when automatically transferring the container 5 using a container conveying robot between the load port 1 and a container storage (stocker) that stocks a plurality of containers 5, at least one of the sets of contact members 98A and 98B can reliably be brought into contact with the handle 52 of the container 5 independently of the moving stroke between the dock position and the undock position. In addition, the lock mechanism 32 is operated in a state in which at least one of the contact members 98A and/or 98B reliably presses the container 5 downward, thereby eliminating the possibility that the engaging claw 32a idles. As a result, the engaging claw 32a reliably engages with an engaging groove 50a, and the container 5 can reliably be locked.

Next, as shown in FIG. 13C, the contact members 98A and 98B of the pressing unit 9 are made to swing to the retreat position, and the contact members 98A are separated from the handle 52. This temporarily cancels pressing of the container 5 downward. As shown in FIG. 14A, a driving mechanism 33 is driven to rotate the dock plate 30 to the operation position. The direction of the container 5 is reversed, and a posture in which the lid 51 faces the side of a port plate 2 is obtained. Next, a driving mechanism 34 is driven to move the dock plate 30 to the dock position, as shown in FIG. 14B.

As shown in FIG. 14C, the contact members 98A and 98B of the pressing unit 9 are made to swing to the pressing position again. The contact members 98A contact the handle 52 of the container 5 again, and the container 5 is pressed downward (against the dock plate 30). If the moving stroke between the dock position and the undock position is large, the contact members 98B cannot contact the container 5. However, since the contact members 98A are in contact with the container 5, the pressing of the container 5 downward is sufficient. After that, the lid portion 51 is opened by a port door 41. A gas is supplied from the gas supply nozzle units 8 into the container 5, and the gas in the container 5 is exhausted from the exhaust nozzle units 7, thereby performing purge of the atmosphere in the container 5.

Since at least the contact members 98A or 98B of the pressing unit 9 reliably press the container 5 downward, floating of the container 5 can be eliminated, and a hindrance that a substrate W cannot appropriately be transferred by an end effector 60 of a substrate conveying robot 6 can be prevented from occurring.

The invention is not limited to the foregoing embodiments, and various variations/changes are possible within the spirit of the invention.

What is claimed is:
1. A load port comprising:
  a dock plate on which a container storing a substrate is placed;
  a port plate including an opening portion capable of taking in and out the substrate;
  a moving mechanism configured to move the dock plate between a dock position close to the port plate and an undock position apart from the port plate;
  a gas supply nozzle unit provided in the dock plate and configured to contact a bottom surface of the container placed on the dock plate and supply a gas into the container; and
  a pressing unit provided above the dock plate and configured to press the container placed on the dock plate downward,
  wherein the pressing unit includes:
  a contact member brought into contact with the container placed on the dock plate; and
  a driving mechanism configured to move the contact member between a first position apart from the container and a second position in contact with the container
  wherein the driving mechanism comprises a rotation driving unit, and a pivot shaft connected to the rotation driving unit,
  wherein the contact member is supported by the pivot shaft via an arm member, and
  wherein the contact member comprises a roller member rotatably provided on a roller shaft supported by the arm member.

2. The load port according to claim 1, wherein the gas supply nozzle unit comprises:
  a nozzle including an air supply hole;
  an elastic member configured to bias the nozzle to a side of the bottom surface of the container; and
  a nozzle support body configured to support the nozzle such that the nozzle can freely move in a vertical direction within a predetermined range.

3. The load port according to claim 1, wherein the rotation driving unit is a rotary actuator to be driven by a supplied air pressure, and
  the load port further comprises:
  a change unit configured to change a rotation direction of the rotary actuator; and
  an air pressure control unit configured to control the air pressure, and
  controls the air pressure to be supplied to the rotary actuator and changes a pressing force of the pressing unit for the container.

4. The load port according to claim 1, further comprising a rotation unit configured to rotate the dock plate,
  wherein the container placed on the dock plate is reversed by the rotation unit.

5. A load port comprising:
  a dock plate on which a container storing a substrate is placed;
  a port plate including an opening portion capable of taking in and out the substrate;
  a moving mechanism configured to move the dock plate between a dock position close to the port plate and an undock position apart from the port plate;
  a gas supply nozzle unit provided in the dock plate and configured to contact a bottom surface of the container placed on the dock plate and supply a gas into the container; and
  a pressing unit provided above the dock plate and configured to press the container placed on the dock plate downward,
  wherein the pressing unit includes:
  a plurality of contact members apart in a moving direction of the dock plate and brought into contact with the container placed on the dock plate, and a driving mechanism configured to move the contact members between a first position apart from the container and a second position in contact with the container, wherein regardless of whether the dock plate is located at the dock position or the undock position, at least one contact member in the second position contacts an upper surface of the container placed on the dock plate.

* * * * *